United States Patent
Chuang et al.

(10) Patent No.: US 8,907,681 B2
(45) Date of Patent: Dec. 9, 2014

(54) TIMING SKEW CHARACTERIZATION APPARATUS AND METHOD

(75) Inventors: Chao Kai Chuang, Hsin-Chu (TW); Yen-Chien Lai, Chuanghua (TW); Hung-Jen Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 652 days.

(21) Appl. No.: 13/046,148

(22) Filed: Mar. 11, 2011

(65) Prior Publication Data

US 2012/0230158 A1 Sep. 13, 2012

(51) Int. Cl.
*G04F 10/00* (2006.01)
*G01R 31/317* (2006.01)
*G01R 31/319* (2006.01)

(52) U.S. Cl.
CPC .... *G01R 31/31726* (2013.01); *G01R 31/31922* (2013.01); *G01R 31/31725* (2013.01)
USPC ............. 324/617; 324/76.35; 324/76.54; 324/613

(58) Field of Classification Search
CPC ................ G01R 31/31725; G01R 31/31922; G01R 31/31726
USPC ........... 324/76.35, 76.54, 613–627; 368/113
See application file for complete search history.

(56) References Cited

U.S. PATENT DOCUMENTS

| | | | | |
|---|---|---|---|---|
| 5,396,183 A | * | 3/1995 | Farwell et al. | 324/617 |
| 6,058,057 A | * | 5/2000 | Ochiai et al. | 365/201 |
| 6,424,583 B1 | | 7/2002 | Sung et al. | |
| 6,657,456 B1 | * | 12/2003 | Jefferson et al. | 326/39 |
| 6,850,051 B2 | * | 2/2005 | Roberts et al. | 324/76.54 |
| 7,737,671 B2 | * | 6/2010 | Figoli | 323/282 |
| 7,795,939 B2 | * | 9/2010 | Chen et al. | 327/199 |
| 8,164,966 B2 | * | 4/2012 | Stratz et al. | 365/201 |
| 2003/0197498 A1 | * | 10/2003 | Watanabe et al. | 324/76.35 |
| 2007/0063752 A1 | * | 3/2007 | Kowalczyk et al. | 327/202 |
| 2008/0208510 A1 | * | 8/2008 | Moessinger et al. | 702/122 |
| 2012/0256639 A1 | * | 10/2012 | Pausini et al. | 324/613 |

OTHER PUBLICATIONS

Zhihong, L., et al., "Self-Calibrate Two-Step Digital Setup/Hold Time Measurement," VLSI-DAT, International Symposium, Apr. 2010, pp. 232-235.

* cited by examiner

Primary Examiner — Arleen M Vazquez
Assistant Examiner — Robert P Alejnikov, Jr.
(74) Attorney, Agent, or Firm — Slater & Matsil, L.L.P.

(57) ABSTRACT

A timing skew characterization apparatus comprises a coarse timing skew characterization circuit, a fine timing skew characterization circuit and a coarse delay cell calibration circuit. The coarse timing skew characterization circuit comprises a plurality of coarse delay cells whose delays can be calibrated through the coarse delay cell calibration circuit. The calibration of fine delay cells can be implemented through a trail and error process. Both coarse delay step and fine delay step can be characterized through a single measurement setup. As a result, the timing skew characterization apparatus provides a high resolution setup and hold time measurement.

13 Claims, 4 Drawing Sheets

| c | b | a | B1 | B2 | B3 | B4 | B5 | B6 | B7 |
|---|---|---|----|----|----|----|----|----|----|
| 0 | 0 | 0 |    |    |    |    |    |    |    |
| 0 | 0 | 1 | ✓  |    |    |    |    |    |    |
| 0 | 1 | 0 | ✓  | ✓  |    |    |    |    |    |
| 0 | 1 | 1 | ✓  | ✓  | ✓  |    |    |    |    |
| 1 | 0 | 0 | ✓  | ✓  | ✓  | ✓  |    |    |    |
| 1 | 0 | 1 | ✓  | ✓  | ✓  | ✓  | ✓  |    |    |
| 1 | 1 | 0 | ✓  | ✓  | ✓  | ✓  | ✓  | ✓  |    |
| 1 | 1 | 1 | ✓  | ✓  | ✓  | ✓  | ✓  | ✓  | ✓  |

TIMING SKEW CHARACTERIZATION APPARATUS AND METHOD

BACKGROUND

As semiconductor technologies evolve, a greater number of devices have been integrated into a single chip. A memory chip may comprise a plurality of transistors and capacitors. In accordance with the characteristics of data storage, semiconductor memory chips may be divided into two major types. One is volatile memory. The other is nonvolatile memory. Among nonvolatile memory chips, a static random access memory (SRAM) chip stores a bit of data in the state of a flip-flop. A dynamic random access memory (DRAM) chip stores a bit of data in a charge in a capacitor. SRAM is faster than DRAM, while SRAM may occupy a larger area than DRAM. Both SRAM chips and DRAM chips comprise various digital circuits synchronized by a variety of different clock signals. As semiconductor technologies further advances, the frequency of memory clock signals increases as well. As a result, the setup and hold time of a digital circuit in either a SRAM chip or a DRAM chip has become shorter.

In a synchronous circuit such as a positive edge triggered D type flip-flop, the setup time is defined as a minimum period in which a data signal is held steady before the leading edge of a clock signal is applied to the D type flip-flop. A valid and constant data signal during such a period can prevent the flip-flop from entering a metastable state in which the output of the D type flip-flop is not predictable. Furthermore, the output of the D type flip-flop may oscillate between a logic low state and a logic high state. Likewise, the hold time is defined as a period after the leading edge of the clock signal. Similarly, during the specified hold time, the data signal must be kept valid and constant so that the flip-flop can generate a valid output. The setup hold time of synchronous circuits may vary based upon different semiconductor processes. A typical setup and hold time may be less than one hundred picoseconds.

In order to avoid metastability induced by lack of enough setup and hold time, the setup and hold time of a synchronous circuit may be characterized and published as supporting information. Based upon measured setup and hold time, the user of synchronous circuits can provide a clock signal having appropriate timing skew. There are a variety of test systems available for characterizing the setup and hold time of synchronous circuits. However, a conventional tester may not provide a resolution in a range of approximately one hundred picoseconds.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, an on-chip timing skew characterization apparatus. The invention may also be applied, however, to timing measurement devices for characterizing the setup and hold time of a variety of synchronous circuits. Furthermore, the invention may also be applied to characterizing the access time of various clock synchronization circuits.

Figure 1:
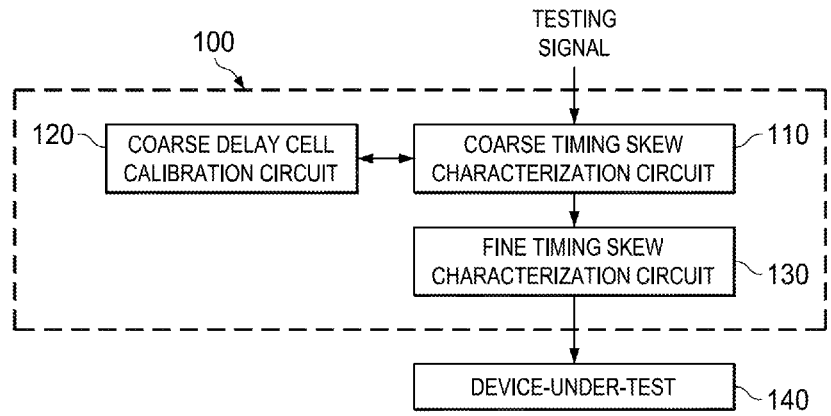
FIG. 1 illustrates a block diagram of an on-chip timing skew characterization apparatus in accordance with an embodiment.

Referring initially to FIG. 1, the block diagram an on-chip timing skew characterization apparatus is illustrated in accordance with an embodiment. The on-chip timing skew characterization apparatus 100 comprises a coarse timing skew characterization circuit 110, a fine timing skew characterization circuit 130 and a coarse delay cell calibration circuit 120. A device-under-test (DUT) 140 is fabricated on the same chip as the on-chip timing skew characterization apparatus 100. In accordance with an embodiment, the DUT 140 may be a synchronous circuit such as a D type flip-flop. In order to characterize the setup and hold time of the DUT 140, a testing signal is applied to the DUT 140 via the on-chip timing skew characterization apparatus 100. The coarse timing skew characterization circuit 110 may comprise a plurality of coarse delay cells formed by various buffers connected in series. The fine timing skew characterization circuit 130 employs a plurality of fine delay cells providing a fine timing resolution by replacing various buffers with high speed inverters, which result in a small amount of delay time compared to buffers.

Both the coarse timing skew characterization circuit 110 and the fine timing skew characterization circuit 130 may comprise a variety of switches, each of which is connected in parallel with a corresponding delay cell. By turning on or off the variety of switches, a particular delay can be determined. More particularly, when a signal passes through one coarse delay cell of the coarse timing skew characterization circuit 110, the total delay time is increased by a coarse delay step. Similarly, the signal may increase by a fine delay step when the signal passes through a fine delay cell of the fine timing skew characterization circuit 130. The minimum setup time or the minimum hold time of the DUT 140 can be determined by adjusting the total delay time from the coarse timing skew characterization circuit 110 and the fine timing skew characterization circuit 130 until the DUT 140 generates a valid output signal. It should be noted that FIG. 1 illustrates the operation of characterizing the setup and hold time of the DUT 140. This diagram is merely an example, which should not limit the scope of the claims. One of ordinary skill in the art would recognize many variations, alternatives and modifications. For example, the illustrative circuit in FIG. 1 may be applicable to characterizing the access time of various clock synchronization circuits. In some embodiments, the delay time of a coarse delay step from a semiconductor device manufactured from a new semiconductor process is unknown before the coarse delay step is characterized. The coarse delay cell calibration circuit 120 coupled to the coarse timing skew characterization circuit 110 is used to calibrate the coarse delay step from the coarse timing skew characterization circuit 110. The detailed operation of the coarse delay cell calibration circuit 120 will be described below with reference to FIGS. 3A and 3B.

Figure 2:
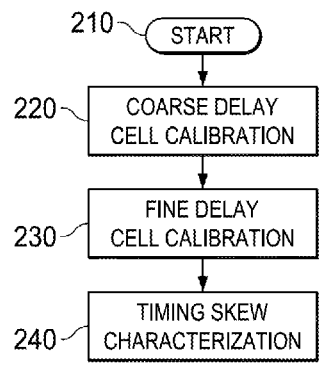
FIG. 2 illustrates a flow chart of a process of determining the setup and hold time of a device in accordance with an embodiment.

FIG. 2 illustrates a flow chart of a process of determining the setup and hold time of a device. It should be noted that the setup time of device includes both a clock setup time and a data setup time. Because the proposed method is applicable to the measurement of either one, the subsequent description uses the setup time to cover both the clock setup time and the data setup time. At step 210, when a new device is under a timing skew characterization process, the built-in coarse timing skew characterization circuit (e.g., coarse timing skew characterization circuit 110 shown in FIG. 1) and fine timing skew characterization circuit (e.g., fine timing skew characterization circuit 130 shown in FIG. 1) are able to report the number of coarse delay steps and fine delay steps that have been employed to meet the minimum setup and hold time. However, in some embodiments, for a device manufactured from a new semiconductor process, both the coarse delay step and the fine delay step are unknown before they are characterized. Therefore, in step 220, the testing process first determines the amount of time a coarse step represents by means of a coarse delay cell calibration circuit (e.g., coarse delay cell calibration circuit 120 shown in FIG. 1). The operation of the coarse delay cell calibration circuit 120 will be described in detail below with respect to FIG. 3. After the amount of time a coarse delay step represents is determined, in step 230, the amount of time a fine step represents can be derived from a mathematical estimate. At step 240, the timing skew characterization apparatus finds the number of coarse delay steps and fine delay steps that are used to meet the setup and hold time of the device. After the total coarse delay steps and fine delay steps have been determined, the minimum setup and hold time of the device can be obtained by converting the coarse steps and fine steps to the corresponding time.

Figure 3A:
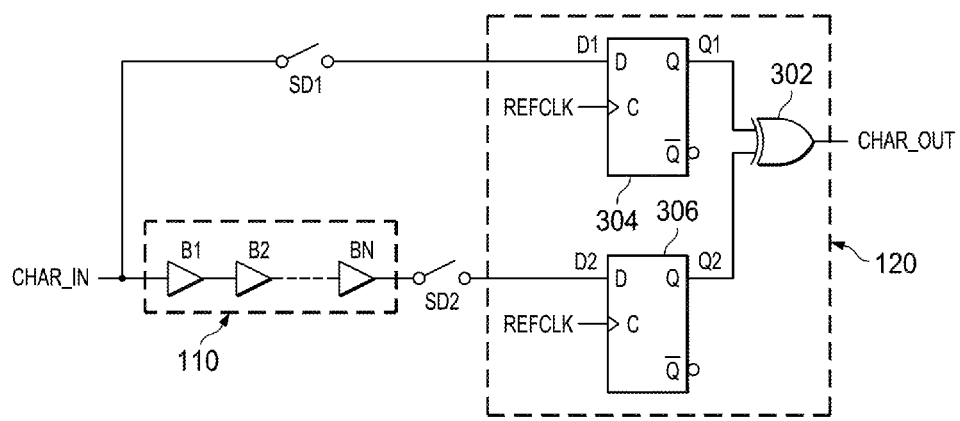
FIG. 3A illustrates the schematic diagram of a coarse delay cell calibration circuit in accordance with an embodiment.

FIG. 3A illustrates the schematic diagram of the coarse delay cell calibration circuit 120 in accordance with an embodiment. The coarse delay cell calibration circuit 120 comprises an exclusive OR gate 302, a first D type flip-flop 304 and a second D type flip-flop 306. A plurality of buffers, namely buffer B1 to buffer BN, are from a buffer chain in the coarse timing skew characterization circuit 110. It should be noted that while FIG. 3A illustrates a plurality of buffers, one skilled in the art will recognize that other and alternate logic gates could be employed (such as employing two inverters connected in series to replace an buffer). There are two switches SD1 and SD2 placed between the plurality of buffers and the coarse delay cell calibration circuit 120. When the coarse delay cell calibration circuit 120 performs the characterization, both switches SD1 and SD2 are turned on so that the buffers are calibrated. On the other hand, when the calibration circuit 120 finishes the characterization, the plurality of buffers are isolated from the coarse delay cell calibration circuit 120 by turning off switches SD1 and SD2. It should be noted that the buffer chain illustrated in FIG. 3A is simply one embodiment and that other configurations for a delay cell chain, including differing numbers of elements, can be employed.

The first D type flip-flop 304 has a data input D1 connected to an input port of the plurality of buffers while the second D type flip-flop 306 has a data input D2 coupled to the input port via the plurality of buffers, which are connected in series to form a buffer chain. As illustrated in FIG. 3A, a characterization input signal CHAR_IN may be sent from the input port to the buffer chain. Both the first D type flip-flop 304 and the second D type flip-flop 306 share the same clock signal REFCLK. The exclusive OR gate has a first input coupled to the output Q1 of the first D type flip-flop 304 and a second input coupled to the output Q2 of the second D type flip-flop 306. The coarse delay cell calibration circuit 120 is used to measure the total delay time from the buffer chain in the coarse timing skew characterization circuit 110.

Figure 3B:
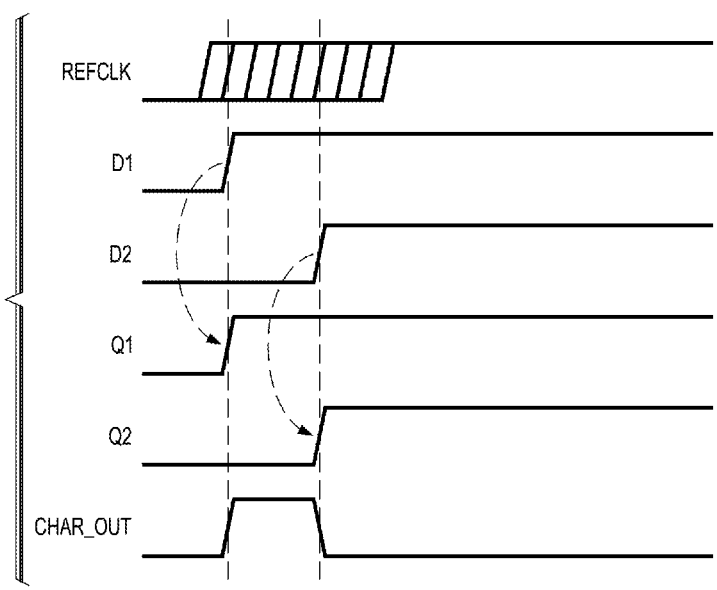
FIG. 3B illustrates a group of timing diagrams showing the operation of the coarse delay cell calibration circuit illustrated in FIG. 3A in accordance with an embodiment.

FIG. 3B illustrates a group of timing diagrams showing the operation of the coarse delay cell calibration circuit 120 illustrated in FIG. 3A. REFCLK represents a group of reference clock signals. The rising edges of the reference clock signals are spaced at equal intervals along a time axis. When a characterization input signal CHAR_IN arrives, the data input D1 of the first D type flip-flop 304 receives the characterization input signal CHAR_IN directly. In contrast, the data input D2 of the second D type flip-flop 306 receives the characterization input signal CHAR_IN via a plurality of buffers. As shown in FIG. 3B, there is a delay between the rising edge of the signal at D1 and the rising edge of the signal at D2. As known in the art, such a delay results from the propagation delay of each buffer. In response to the plurality of reference clock signals, the output Q1 of the first D type flip-flop 304 takes on the state of the data input D1 at each rising edge of the reference clocks. As shown in FIG. 3B, when the data input D1 changes from a logic low state to a logic high state, in response to this change, the output Q1 changes to a logic high state accordingly. After a delay period, when the data input D2 changes from a logic low state to a logic high state, likewise, the output Q2 changes to a logic high state.

Both the output Q1 and the output Q2 are sent to the first input and the second input of the exclusive OR gate 302, respectively. In accordance with the operation of the exclusive OR gate, the output of the exclusive OR gate 302 is high when the inputs are not alike. As a result, the exclusive OR gate 302 generates a logic high state during the delay period. The logic high period shown at CHAR_OUT represents the sum of a plurality of propagation delays from the buffer chain placed between the characterization input signal CHAR_IN and the data input D2 of the second D type flip-flop 306. In some embodiments, although the delay of a single buffer is in picosecond time scale, the total delay from a plurality of buffers is in nanosecond time scale so that a tester having an ordinary resolution can test the total delay correctly.

According to an embodiment, a tester with a resolution of 175 picoseconds is used to measure the total delay from 128 buffers connected in series. The total delay is approximately 2000 picoseconds. Because these 128 buffers are fabricated on the same die and located in close proximity to each other, these 128 buffers may show similar characteristics. More particularly, each buffer may have approximately identical propagation delay. Therefore, each buffer's delay can be derived from the total delay divided by the number of buffers. In the example described above, each buffer may have a propagation delay equal to 2000 picoseconds divided by 128, that is, 15.63 picoseconds. In addition, the inaccuracy of each buffer's measured propagation delay can be estimated as the resolution of the tester divided by the number of buffers. In this example, the inaccuracy of measurement is the tester's resolution 175 picoseconds divided by 128. In other words, by employing the coarse delay cell calibration circuit 120 shown in FIG. 3A to calibrate the coarse timing skew characterization circuit 110 shown in FIG. 1, the inaccuracy of measurement for each buffer is 1.37 picoseconds in accordance with an embodiment.

One advantageous feature of the coarse delay cell calibration circuit is that a tester having a low resolution such as nanosecond time scale can be used to calibrate a buffer's propagation delay, which is in picosecond time scale. The example in the previous paragraph shows a tester having a resolution of 175 picoseconds can provide picosecond accuracy by using the tester to measure CHAR_OUT rather than the output of each buffer cell. It should be noted that while FIG. 3A illustrates a schematic diagram of a coarse delay cell calibration circuit based upon two D-type flip-flops and an exclusive OR gate, a person having ordinary skills in the art will recognize that there are many alternative ways to capture the total delay from a plurality of buffers. The circuit illustrated herein is limited solely for the purpose of illustrating the inventive aspect of the various embodiments. The present invention is not limited to any particular logic circuit for capturing the total delay.

Figure 4:
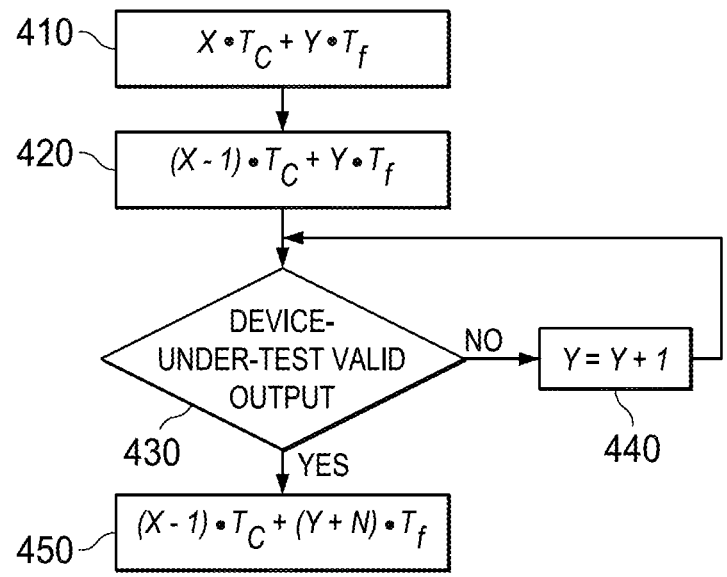
FIG. 4 illustrates a flow chart of a process of determining a fine delay step in accordance with an embodiment.

FIG. 4 illustrates a flow chart of a process of determining a fine delay step. As described above with respect to FIG. 3A, a coarse delay step can be determined by dividing a total delay measured from a group of buffers by the number of buffers contributing to the total delay using the coarse delay cell calibration circuit 120. In some embodiments, however, a fine delay step can be derived from a trial and error process illustrated in the flow chart shown in FIG. 4, using the fine timing skew characterization circuit 130.

At step 410, according to an embodiment, after testing a DUT, a tester tests and reports that X coarse delay steps and Y fine delay steps are required to meet the setup and hold time of the DUT. $T_C$ is the delay time of a coarse step and $T_f$ is the delay time of a fine step. As a result, the total time delay is represented by $X \cdot T_C + Y \cdot T_f$. At step 420, the tester reduces a coarse delay step by removing a buffer from the signal path of the coarse timing skew characterization circuit 110. The total number of coarse delay steps is therefore X−1, and the total delay time is $(X-1) \cdot T_C + Y \cdot T_f$. For illustration, in response to the removal of a coarse delay step, the DUT cannot generate a valid output, which indicates that the setup and hold time is not satisfied. At step 430, the tester observes the invalid output and directs the process to step 440 in which a fine delay step is added by forcing the characterization signal to pass through one more fine delay cell. Consequently Y=Y+1. After that, according to the flow chart, the tester performs the step 430 again. If the total delay can meet the setup and hold time of the DUT, the tester enters step 450. As illustrated in FIG. 4, at step 450, N fine delay steps are equivalent to a coarse delay step so that the DUT generate a valid output. In other words, the total delay time from $(X-1) \cdot T_C + (Y+N) \cdot T_f$ is approximately equal to that from $X \cdot T_C + Y \cdot T_f$. After finding the scale factor between a coarse delay step and a fine delay step, the tester reports the scale factor (e.g., N fine delay steps are equal to a coarse step). Otherwise, the tester repeats the step 440 until the total delay meets the setup and hold time of the DUT.

As an example, after reducing a coarse delay step (step 420), the DUT does not generate a valid output until six fine delay steps have been added into the characterization process (steps 430 and 440). Therefore, in this example, the scale factor between a coarse delay step and a fine delay step is six. A person having ordinary skill in the art will recognize that in a real application a coarse delay step may be equal to any number of fine delay steps. Six fine delay steps are selected purely for demonstration purposes. As described above with reference to FIG. 3B, a coarse delay step may be 15.63 picoseconds. The trial and error process shows six fine delay steps are roughly equal to one coarse delay step. Therefore, a fine delay step can be determined by dividing a coarse delay step by six. That is, 2.61 picoseconds. An advantageous feature of the fine delay step calibration process shown in FIG. 4 is that both the coarse delay step and the fine delay step can be calibrated by a single measurement setup. Based upon the calibration results of the coarse delay cell calibration circuit 120, the fine delay cell calibration can be implemented via a mathematic derivation. Such a mathematic derivation reduces the possibility of having extra measurement errors due to a different measurement setup.

Figure 5:
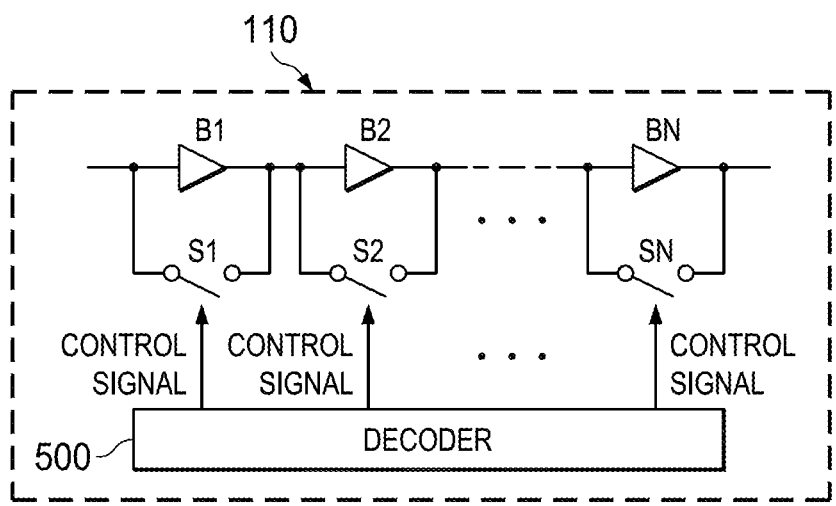
FIG. 5 illustrates a simplified diagram of the coarse timing skew characterization circuit 110 shown in FIG. 1 in accordance with an embodiment.
Figures 6, 7:
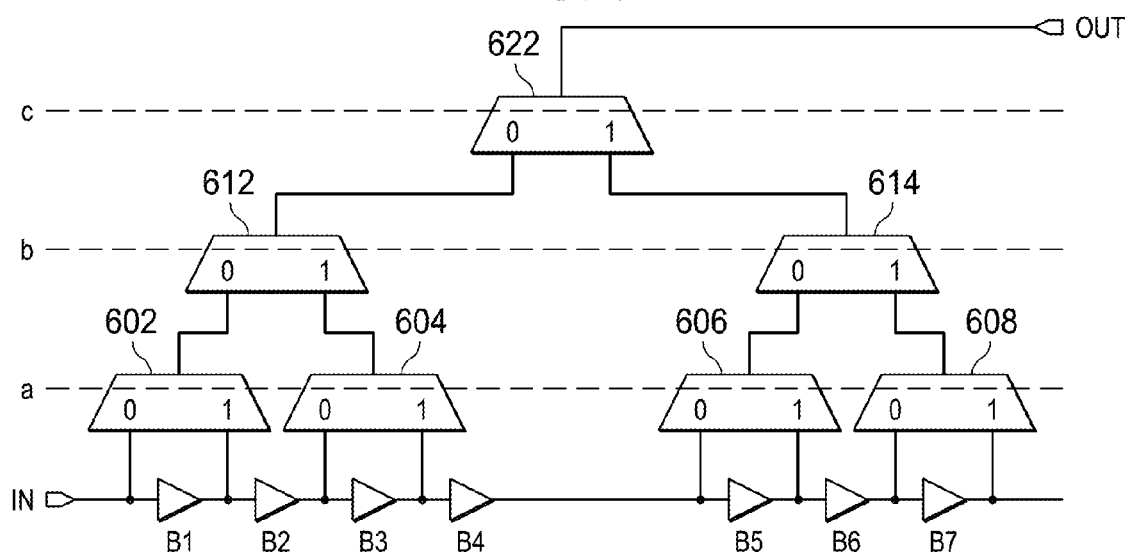
FIG. 6 illustrates an alternative implementation of the coarse timing skew characterization circuit 110 shown in FIG. 1 in accordance with an embodiment.
FIG. 7 illustrates the operation of the coarse timing skew characterization circuit shown in FIG. 6.

FIG. 5 illustrates a schematic diagram of the coarse timing skew characterization circuit 110 shown in FIG. 1. The coarse timing skew characterization circuit 110 comprises a plurality of buffers connected in series. Each buffer (e.g., B1) is connected to a switch (e.g., S1) in parallel. A decoder 500 generates a control signal for each switch. When a switch (e.g., S1) is turned on, the switch provides a bypass route for the characterization signal. As a result, the total delay time is reduced by a coarse delay step. In contrast, when a switch is turned off, the characterization signal passes through the buffer. As a result, a coarse delay is added into the characterization signal. It should be noted that the schematic diagram shown in FIG. 5 is merely an example, which should not limit the scope of the claims. One of ordinary skill in the art would recognize many variations, alternatives and modifications. For example, FIG. 6 shows an alternative implementation of the buffer chain. In accordance with an embodiment, a 3-bit binary code formed by a, b and c are used to control the operation of a group of multiplexers. More particularly, a control signal a is used to control the operation of multiplexers 602, 604, 606 and 608. A control signal b is used to control the operation of multiplexers 612 and 614. A control signal c is used to control the operation of multiplexer 622.

FIG. 7 illustrates in detail the operation of the buffer chain shown in FIG. 6. For example, when the 3-bit binary code is "000", each multiplexer's input "0" is selected. As a result, IN signal bypasses all buffers and reach OUT without delay. On the other hand, when the 3-bit binary code is "111", each multiplexer's input "1" is selected, IN signal passes through the path formed by buffers B1, B2, B3, B4, B5, B6 and B7. When the 3-bit binary code is in between "000" and "111," IN signal passes through various buffers as illustratively marked in FIG. 7. An advantageous feature of having a group of multiplexers is that the total delay time can be adjusted by setting the value of the 3-bit binary code.

Figure 8:
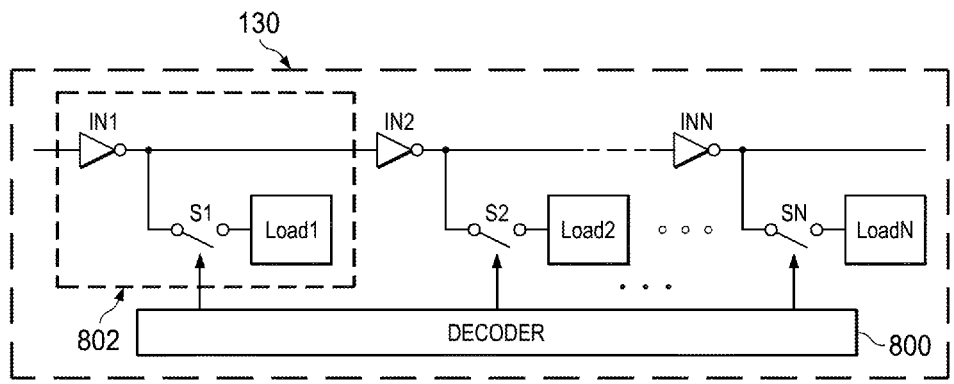
FIG. 8 illustrates an exemplary circuit of the fine timing skew characterization circuit 130 shown in FIG. 1 in accordance with an embodiment.

FIG. 8 illustrates an exemplary circuit of the fine timing skew characterization circuit 130 shown in FIG. 1. The fine timing skew characterization circuit 130 comprises a plurality of fine delay cells (e.g., fine delay cell 802). As known in the art, if there is no load at the output of an inverter, the inverter may provide a fast signal channel wherein the propagation delay of the inverter is approximately equal to zero. In addition, the propagation delay of an inverter is proportional to the load level at the output of the inverter. As shown in FIG. 8, each fine delay cell is connected to a load via a controllable switch (e.g., S1, S2 and SN). A decoder 800 is used to control the on/off of each controllable switch so that the fine timing skew characterization circuit 130 can add or delete fine delay steps accordingly. More particularly, when a controllable switch is turned on, a fine delay step is added into the fine timing skew characterization circuit 130 because a load is connected to the output of an inverter. On the other hand, when a controllable switch is turned off, the inverter's propagation delay is approximately equal to zero. As a result, a fine delay step is deleted from the fine timing skew characterization circuit 130. It should be noted that FIG. 8 only illustrates a simplified circuit diagram solely for the purpose of illustrating the inventive aspects of the various embodiments. One of ordinary skill in the art will recognize other and alternate embodiment including logic gates could be employed for this function.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   a coarse timing skew characterization circuit having a buffer chain, a buffer of the buffer chain including a propagation delay;
   a coarse delay cell calibration circuit configured to measure a delay between an input of the buffer chain and an output of the buffer chain; and
   a fine timing skew characterization circuit connected between the coarse timing skew characterization circuit and a device-under-test (DUT), wherein a delay time of a fine delay step of the fine timing skew characterization circuit is determined based upon a setup and hold time of the DUT.

2. The apparatus of claim 1, wherein the buffer chain further comprises a plurality of buffers connected in series, a plurality of switches, each of which is connected in parallel to a corresponding buffer and a decoder capable of turning on or off respective ones of the plurality of switches.

3. The apparatus of claim 1, wherein the coarse delay cell calibration circuit comprises:
   a first flip-flop having a first data input connected to an input of a first buffer of the buffer chain and a first clock input configured to receive a reference clock signal;
   a second flip-flop having a second data input connected to an output of the buffer chain and a second clock input configured to receive the reference clock signal; and
   an exclusive OR gate having a first input connected to an output of the first flip-flop and a second input connected to an output of the second flip-flop.

4. The apparatus of claim 1, wherein the fine timing skew characterization circuit comprises a plurality of fine delay cells connected in series, a plurality of switches, each of the plurality of switches is coupled to a load and a decoder capable of turning on or off respective ones of the plurality of switches.

5. The apparatus of claim 4, wherein each fine delay cell comprises an inverter, a switch, and a load coupled to the output of the inverter.

6. The apparatus of claim 4, wherein the device-under-test (DUT) is fabricated on a same die as the coarse timing skew characterization circuit, the fine timing skew characterization circuit and the coarse delay cell calibration circuit.

7. The apparatus of claim 4, wherein the coarse timing skew characterization circuit and the fine timing skew characterization circuit are configured to perform a trial and error process in which a scale factor between a coarse delay step and a fine delay step is determined.

8. A system comprising:
   a device-under-test (DUT);
   a timing skew characterization apparatus having an input configured to receive a characterization signal and an output coupled to the DUT, the timing skew characterization apparatus comprising:
      a coarse timing skew characterization circuit having a buffer chain, a buffer of the buffer chain including a propagation delay; and
      a coarse delay cell calibration circuit configured to measure a delay between an input of the buffer chain and an output of the buffer chain; and
   a fine timing skew characterization circuit connected in series to the coarse timing skew characterization circuit, wherein a delay time of a fine delay step of the fine timing skew characterization circuit is determined based upon a valid output generated by the DUT.

9. The system of claim 8, wherein the DUT and the timing skew characterization apparatus are fabricated on a same die.

10. The system of claim 8, wherein the coarse timing skew characterization circuit and the coarse delay cell calibration circuit are fabricated one a same die.

11. The system of claim 8, wherein the coarse timing skew characterization circuit comprises a plurality of buffers connected in series, a plurality of multiplexers, each of which is configured such that:
   the characterization signal bypasses the plurality of buffers when a first input of each multiplexer is selected; and
   the characterization signal passes the plurality of buffers when a second input of each multiplexer is selected.

12. The system of claim 8, wherein the DUT, the coarse timing skew characterization circuit and the fine timing skew characterization circuit are configured to perform a trial and error process in which a scale factor between a coarse delay step and a fine delay step is determined.

13. The system of claim 8, wherein the DUT, the coarse timing skew characterization circuit and the fine timing skew characterization circuit are configured to perform a setup and hold time characterization test in which a setup and hold time of the DUT is determined when the DUT outputs a valid output signal after a number of coarse delay steps and fine delay steps are added into a characterization signal path formed by the coarse timing skew characterization circuit and the fine timing skew characterization circuit.

\* \* \* \* \*